(12) United States Patent
Coq et al.

(10) Patent No.: US 11,105,863 B2
(45) Date of Patent: *Aug. 31, 2021

(54) BURN-IN SYSTEM ENERGY MANAGEMENT

(71) Applicant: International Business Machines Corporation, Armonk, NY (US)

(72) Inventors: Marc Coq, Hopewell Junction, NY (US); Randhir S. Malik, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 274 days.

This patent is subject to a terminal disclaimer.

(21) Appl. No.: 16/243,136

(22) Filed: Jan. 9, 2019

(65) Prior Publication Data

US 2019/0146041 A1 May 16, 2019

Related U.S. Application Data

(63) Continuation of application No. 14/802,226, filed on Jul. 17, 2015, now Pat. No. 10,241,156.

(51) Int. Cl.
*G01R 31/40* (2020.01)
*G01R 31/28* (2006.01)

(52) U.S. Cl.
CPC .......... *G01R 31/40* (2013.01); *G01R 31/2855* (2013.01)

(58) Field of Classification Search
CPC .......................... G01R 31/40; G01R 31/2855
USPC .......................... 324/750.05, 750.06, 750.07
See application file for complete search history.

(56) References Cited

U.S. PATENT DOCUMENTS

| | | | |
|---|---|---|---|
| 6,614,231 B2 | 9/2003 | Thrap | |
| 9,906,117 B1 * | 2/2018 | Hoffman | ................ H02M 1/00 |
| 2008/0238196 A1 | 10/2008 | Yan et al. | |
| 2012/0306408 A1 | 12/2012 | Chung et al. | |
| 2013/0069666 A1 | 3/2013 | Wong | |
| 2013/0127482 A1 | 5/2013 | Chang et al. | |
| 2016/0054374 A1 * | 2/2016 | Walker | ............. G11C 11/40626 |
| | | | 324/750.06 |
| 2016/0227616 A1 | 8/2016 | Lee | |

(Continued)

FOREIGN PATENT DOCUMENTS

DE 102010024465 A1 12/2011
GB 2489707 A 10/2012

OTHER PUBLICATIONS

Casten, et al., "Deploying Clean Energy: Overcoming Regulatory Barriers", White Paper, Recycled Energy Development, LLC, Westmont 2009. 12 pages.

(Continued)

*Primary Examiner* — Tung X Nguyen
*Assistant Examiner* — Robert P Alejnikov, Jr.
(74) *Attorney, Agent, or Firm* — Stosch Sabo

(57) ABSTRACT

A method and system for re-using the electrical energy of an electronic component under test. The method and system includes combining a first direct current voltage output of an electronic component under test with a second direct current voltage of a device. The combined first direct current voltage and second direct current voltage are regulated to create a power. The power functions a system application. At least one metric of the electronic component under test is monitored.

14 Claims, 4 Drawing Sheets

(56) References Cited

U.S. PATENT DOCUMENTS

2017/0016964 A1 1/2017 Coq et al.
2018/0252764 A1* 9/2018 Chang ................ G01R 31/2863

OTHER PUBLICATIONS

Lim, "Recycling of Wasted Energy: Thermal to Electrical Energy Conversion", UC San Diego Electronic Theses and Dissertation, 2011. 123 pages.
IBM, List of IBM Patents or Patent Applications Treated as Related, Jan. 9, 2019, 2 pages.

* cited by examiner

BURN-IN SYSTEM ENERGY MANAGEMENT

BACKGROUND

The present disclosure relates to electronic testing, and more specifically, to burn-in test systems.

Manufactured electronic devices and systems can undergo burn-in testing to verify the functionality of the electronic systems or sub-systems prior to distribution. Burn-in testing may include variation of supply voltage, current, and/or device operating temperature according to a predetermined test regimen.

SUMMARY

Aspects of the disclosure include a method of testing at least one electronic component. The method may include testing each electronic component, where each electronic component outputs a respective first direct current voltage as a result of the testing. Each first direct current voltage may be combined with a second direct current voltage to create a third direct current voltage. The third direct current voltage may use a selective proportion of each respective first direct current voltage and the second direct current voltage to create the third direct current voltage. The second direct current voltage may be output by a device. The third direct current voltage may be regulated to create a first power. The first power may be applied to at least one system application. Each system application may perform a respective function as a result of receiving the first power. One or more performance characteristics of each electronic component may be monitored.

Aspects of the disclosure include a method for testing at least one electronic component. Each electronic component may output a first direct current voltage as a result of testing. Each first direct current voltage may be combined. The combined first direct current voltages may be regulated to produce a second direct current voltage. The second direct current voltage may comprise a selective proportion of each respective first direct current voltage. The second direct current voltage may be regulated with a third direct current voltage to output a first power having a first resistance. The first power may comprise a selective proportion of the second direct current voltage and the third direct current voltage. The third direct current voltage may be output by a device. The first power may be applied to at least one system application having a second resistance. Each system application may perform a respective function as a result of applying the first power. At least one metric may be monitored for each electronic component.

Aspects of the disclosure include a system for testing an electronic component. The system may include at least one electronic component under test. Each electronic component may output a respective first direct current voltage. The system may include a device configured to output a second direct current voltage. The system may include a power regulator outputting a first power based on the second direct current voltage and each respective first direct current voltage. The system may include at least one system application operably coupled to the power regulator and configured to receive the first power. Each system application may perform at least one function as a result of receiving the first power. The system may further include a component monitor configured to monitor at least one metric of the at least one electronic component under test.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
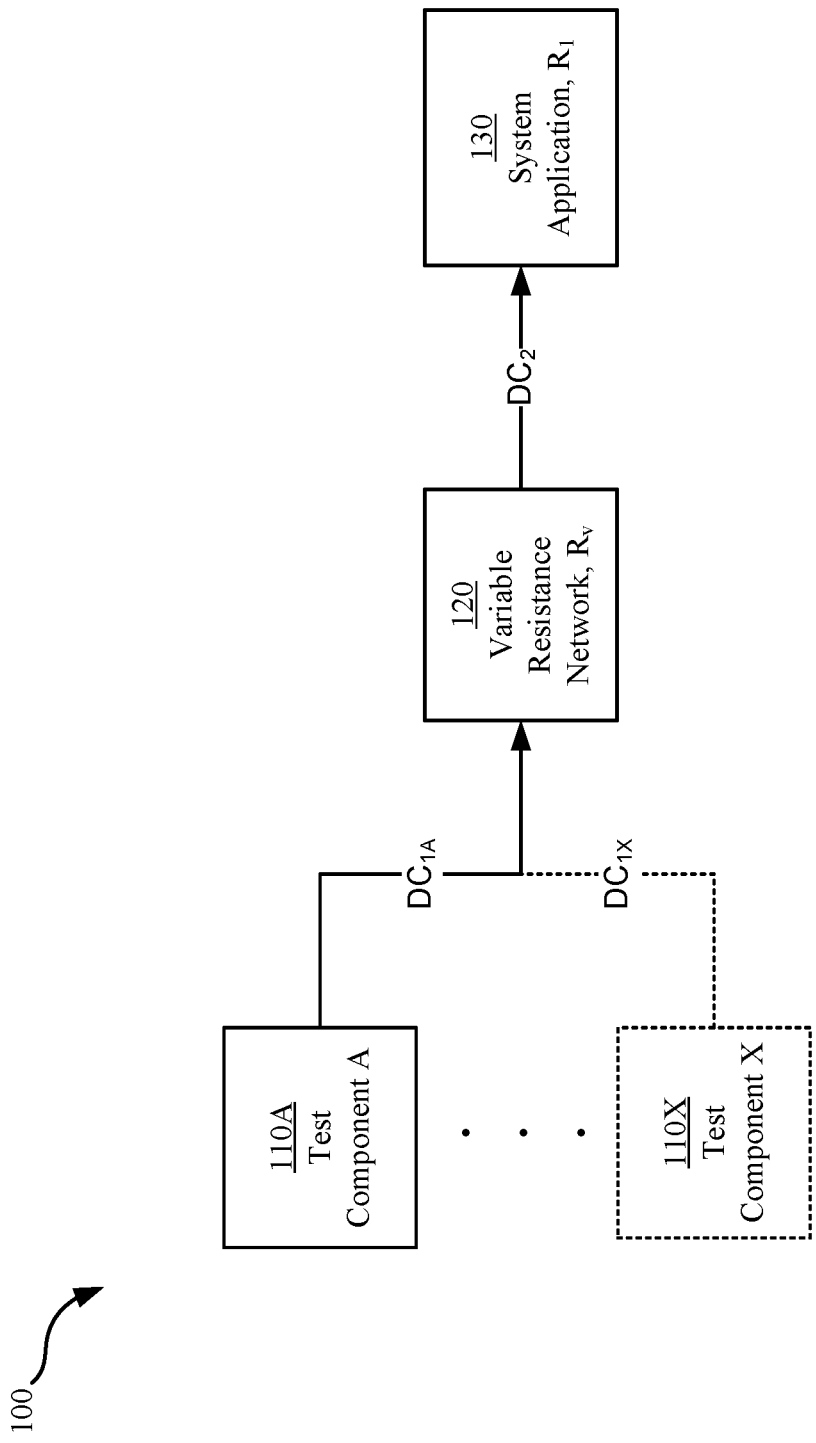
FIG. 1 illustrates a block diagram of one example of a burn-in test system in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Burn-in testing of electronic devices can last for minutes, hours, or days. A burn-in test regimen may require each manufactured electronic device to be tested, or it may require a subset of a group of electronic devices to be tested (i.e., sample testing). In either case, the cumulative burn-in test time, the number of tests, and burn-in test system inefficiencies can result in wasted energy.

Burn-in test systems can use resistive loads to stress and/or exercise a given electronic component. In cases where a resistive load is used, the electrical power provided to the electronic device under test is dissipated as heat. Thus, exhaust and/or cooling systems are required to dissipate the excess heat, thereby increasing the energy use of the burn-in test system by necessitating additional, electrically-powered equipment.

The present disclosure describes a method and system to efficiently re-use electrical energy consumed by burn-in test systems. In accordance with some embodiments, the present disclosure advantageously allows for the burn-in electrical energy to be applied to a load, and furthermore, to ensure the powered load is not disrupted by a sudden voltage, current, or resistance change caused by a test component failure. In addition, various embodiments of the present disclosure efficiently transmit power by using, for example, variable resistance networks and pulse width modulators. As described above, aspects of the present disclosure have many advantages, however, not all embodiments of the present disclosure contain any or all of the listed advantages, and furthermore, not all advantages of the various embodiments of the present disclosure are listed herein.

A variety of electronic components undergo burn-in testing. According to various embodiments of the present disclosure, the electronic component undergoing burn-in testing (i.e., the test component) is a power supply. As understood by one skilled in the art, some power supplies convert high voltage alternating current (AC) (e.g., from a home outlet) to low voltage direct current (DC) suitable for electronics (e.g., cell phones, laptops, etc.). According to alternative embodiments, the unit under test is an electronic component having a direct current output. The test component can have an AC or a DC input voltage, or the electronic component can have no input but may nonetheless produce a DC voltage output (e.g., a battery). In some embodiments, multiple components are tested simultaneously. In such a case, the plurality of test components can be the same or different electronic devices.

According to some embodiments of the present disclosure, the output DC voltage of each test component is input to a regulator. As understood by one skilled in the art, a regulator alters one or more input voltages to a larger or smaller output voltage having an equal or lesser equivalent power. The desired output voltage is defined by a user.

In some embodiments, the regulator independently controls the proportion of each DC input voltage used to generate a given DC output voltage. For example, given two DC input voltages $V_1$ and $V_2$, an equal or unequal proportion of each DC voltage could be used in generating a DC output voltage $V_3$. Alternatively, either $V_1$ or $V_2$ could be used exclusively to generate $V_3$. Further still, a combination of the aforementioned examples could occur. For example, according to some embodiments, conditional instructions are associated with the regulator such that the regulator produces a given voltage in a given manner unless a predefined environmental condition triggers a change. The change causes the regulator to produce the given voltage in an alternative manner. As a specific example, equal proportions of $V_1$ (from a test component) and $V_2$ (from an external device) could initially be used to generate $V_3$, however, following an indication of imminent failure of the test component, the regulator could exclude the input of $V_1$ for the remainder of the burn-in test and draw the necessary amount of energy from $V_2$ to generate $V_3$.

According to some embodiments of the present disclosure, one or more variable resistance networks are used to transfer power from a regulator to a system application. As is understood by one skilled in the art, in the case of a direct current circuit, a variable resistance network applies a selective resistance (i.e., a source resistance) to a power source which is larger than, less than, or equal to the resistance of the system application (i.e., a load resistance). In some cases where the source resistance is substantially equal to the load resistance, the maximum power possible is transferred to the system application. In some cases where the source resistance is less than the load resistance, a smaller amount of power is transferred to the system application, however the power is transferred with a greater efficiency. In some cases where the source resistance is greater than the load resistance, a larger current is transferred to the system application.

In various situations it is beneficial to have the resistance of the variable resistance network larger, smaller, or equal to the resistance of the load. As an example, if a considerable amount of power is being transferred to the load where poor efficiency would result in substantial loss, it may be beneficial to decrease the source resistance with respect to the load resistance in order to increase the transfer efficiency. Alternatively, in cases where a small amount of power is being transferred and there is a limited power supply, it may be acceptable to transfer the maximum power possible with less efficiency than the previous example (wherein the decreased efficiency generates an acceptable amount of wasted energy per the user's goals). In many cases, a compromise between power transfer and transfer efficiency will result in the most beneficial outcome.

In embodiments of the present disclosure, a power regulator is used to control the power output of one or more direct current voltage inputs. As is understood by one skilled in the art, a power regulator refers to, but is not limited to, regulators, converters, or boosters which use electrical, electromechanical, electrochemical, or electromagnetic processes to control the power output of one or more power inputs. In some cases power regulators are linear regulators or switching regulators. An example of a switching regulator is a pulse width modulator (PWM). It should be understood that any reference to a PWM, as herein described, refers to any device or circuit associated with applying the technique of pulse width modulation.

In accordance with some embodiments, a PWM is used to receive one or more DC voltage inputs and generate an AC or DC power output. As is understood by one skilled in the art, a PWM acts as a switch to control power output. The PWM switching frequency can be constant or dynamic. In cases where the switching frequency is dynamic, the PWM can act as an inverter. Specifically, the PWM can dynamically segment a direct current to substantially produce a sinusoidal imitation of an alternating current. Alternatively, the PWM can deliver variable direct current loads to devices such as, but not limited to, variable speed motors by maintaining various constant frequencies. Advantageously, PWMs exhibit high efficiencies due to minor power losses across the open or closed switch of the PWM.

In accordance with embodiments of the present disclosure, the energy used to conduct the burn-in test is subsequently re-used. Specifically, the test component output energy is ultimately input to a system application. The system application is any application performing one or more functions. A non-exhaustive list of potential system applications includes, for example, a variable speed motor, a server, an electronic ballast, or an electronic component undergoing burn-in testing. In various embodiments of the present disclosure, the system application receives a DC power. Advantageously, a DC power increases the efficiency of the burn-in test system by avoiding power losses associated with a DC-AC inversion.

According to various embodiments, more than one system application is powered by the re-used energy of the disclosed burn-in system. Specifically, more than one system application is connected in series or in parallel with a first system application. In various embodiments the system applications perform similar or dissimilar functions with respect to each other system application.

In an exemplary embodiment, a power supply undergoing burn-in testing outputs a single voltage or multiple voltages in the range of 3-12 volts. Based on the one or more voltages and their associated currents, the power supply outputs 100-1,500 watts. The output wattage can be applied to one or more system applications. The power supply output wattage can be exclusively applied to the one or more system applications, or the power supply output wattage can be applied in tandem with a secondary current source. As is understood by one skilled in the art, the voltages, currents, and wattages associated with the exemplary power supply vary dramatically according to the class and type of power supply. Thus, the exemplary embodiment presently described should not be construed as limiting with respect to the present disclosure.

In some embodiments of the present disclosure, one or more performance metrics is collected, displayed, and/or monitored for each test component, system application, or any other aspect of the presently disclosed burn-in system. A non-limiting list of performance metrics includes, for example, any one, or any combination of, voltage, current, resistance, power, temperature, time, and efficiency. In cases where a combination of the aforementioned variables are used to produce a performance metric, the performance metric can be a mathematical function of the combination of variables. In some embodiments, the performance metric(s) is displayed on a user-interface. In alternative embodiments, the performance metric(s) provides information to other aspects of the presently disclosed burn-in test system (e.g., via feedback loops). Furthermore, in some embodiments comprising a user-interface, the user-interface allows for modification of various components within the burn-in test system. For example, in various embodiments, a user selects the proportion of power from each regulator input to be used in generating the regulator output. Alternatively, the user has the option to turn on, turn off, or moderate power going to various system applications where multiple system applications exist. In a specific embodiment, a user can exclude the power input from a failed or failing test component to a voltage regulator. Depending on available alternative power sources, the user may also subsequently decrease power to one or more system applications in order to run all system applications at a lower power level, or in order to run selected system applications at a normal power level and other system applications at a reduced power level.

The various components associated with the present disclosure (e.g., user interface, voltage regulator, power regulator, high voltage direct current (HVDC) component, system application, etc.) execute and/or store computer readable instructions in some embodiments. As a result, components associated with the present disclosure may contain, but are not limited to, memory, storage, processors, I/O devices, network connections, local connections, etc.

As described, burn-in test systems in accordance with the present disclosure are structured in a variety of ways. As such, a description of figures associated with embodiments of the present disclosure will be helpful. The following figures are block diagrams of various functional orientations for embodiments of the present disclosure. As understood by one skilled in the art, the electronic components specified in the various diagrams can be combined, separated, replicated, or modified using standard engineering practices while remaining within the spirit and scope of the present disclosure. Furthermore, as understood by one skilled in the art, the various components specified in the various diagrams may contain a plurality of electronic elements such as, but not limited to, resistors, transformers, amplifiers, cables, wires, transistors, switches, gates, diodes, etc. In some cases, the electronic elements are arranged in a circuit or a sub-circuit which is shared by, or replicated across, multiple blocks of the various block diagrams while remaining within the spirit and scope of the present disclosure.

Referring now to the Figures, FIG. 1 illustrates a block diagram of one example of a burn-in test system in accordance with some embodiments of the present disclosure. The burn-in test system 100 includes one or more test components 110A-110X where "X" is a variable representing the total number of test components. Each test component receives an AC or DC voltage input, or no input (e.g., a battery). Each test component produces a respective direct current voltage $DC_{1A}$-$DC_{1X}$. The test components 110A-110X are similar or dissimilar electronic components according to various embodiments. Thus, some test components 110A-110X may receive an AC voltage input while others receive a DC voltage input or no input at all. Likewise, the direct current output voltages are not necessarily similar in magnitude as a result of the variety of potential electronic test components 110A-110X.

The direct current voltages $DC_{1A}$-$DC_{1X}$ are combined in a variable resistance network 120 having a resistance $R_v$. The resistance $R_v$ is modifiable. According to various embodiments, the resistance $R_v$ is modified to be substantially equal to the resistance $R_1$ associated with system application 130. In alternative embodiments, the resistance $R_v$ is modified to be substantially less than the resistance $R_1$ associated with system application 130. For example, the ratio $R_v/R_1$ can be in the range of 0.1 to 1, and as a further example, 0.5 to 1 according to various embodiments. However, any number of ranges of $R_v$ with respect to $R_1$ are contemplated depending on, for example, the magnitude of the various DC voltages, the power requirements of the one or more system applications 130, the duration of the testing, and the goals of the user.

The variable resistance network 120 outputs a direct current voltage $DC_2$ to the system application 130. In various embodiments, the variable resistance network 120 provides multiple outputs to multiple system applications 130. In alternative embodiments, multiple variable resistance networks 120 are associated with each system application 130 or a subset of a plurality of system applications 130. The system application 130 receives the direct current voltage $DC_2$ and performs one or more functions as a result of receiving the direct current voltage $DC_2$.

Figure 2:
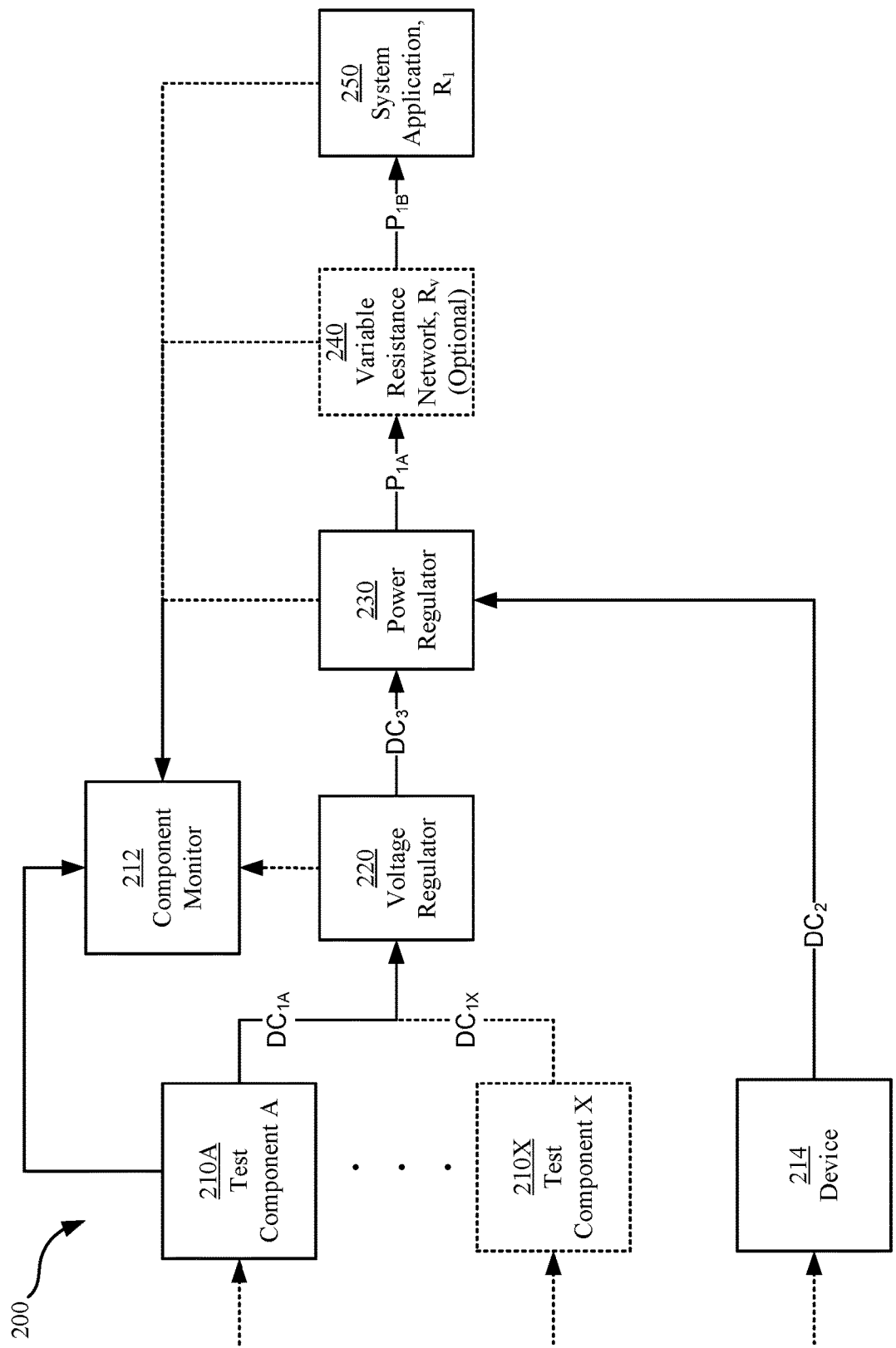
FIG. 2 illustrates a block diagram of another example of a burn-in test system in accordance with some embodiments of the present disclosure.

Referring now to FIG. 2, shown is a block diagram illustrating another example of a burn-in test system in accordance with some embodiments of the present disclosure. Burn-in test system 200 contains one or more test components 210A-210X where "X" represents the number of test components. Each test component receives an AC or DC voltage input, or no input. Each test component 210A-210X outputs a direct current voltage $DC_{1A}$-$DC_{1X}$. The test components 210A-210X are similar or dissimilar electronic components according to various embodiments. As such, the direct current voltage outputs $DC_{1A}$-$DC_{1X}$ are equal or different in magnitude.

Direct current voltages $DC_{1A}$-$DC_{1X}$ flow to voltage regulator 220. In some embodiments, the voltage regulator 220 selectively moderates the proportions of the various inputs used to produce a direct current voltage $DC_3$. A device 214 produces direct current voltage $DC_2$. According to various embodiments, the device 214 is a rectifier, regulator, DC bus, battery, capacitor, or any combination of the aforementioned devices. Direct current voltages $DC_3$ and $DC_2$ are subsequently input to a power regulator 230. The power regulator 230 selectively moderates the proportions of the inputs $DC_2$ and $DC_3$ to output power $P_{1A}$. According to some embodiments, the power regulator 230 matches the voltages $DC_1$ and $DC_2$ using, for example, a matching circuit. According to various embodiments the power regulator is a pulse width modulator (PWM), a voltage regulator, a linear regulator, a switching regulator, a DC-DC converter, or another device producing a power from one or more inputs using electrical, electromechanical, electrochemical, or electromagnetic methods. It is to be understood that the examples of device 214 and power regulator 230 discussed herein are by way of example only and are not to be construed as limiting.

In some embodiments, power $P_{1A}$ is input to a variable resistance network 240 (optionally shown via the dotted box) having resistance $R_v$. Resistance $R_v$ is equal to or less than the resistance $R_1$ associated with system application 250 according to various embodiments. The variable resistance network 240 outputs DC power $P_{1B}$ having resistance $R_v$. DC power $P_{1B}$ is input to system application 250 and causes system application 250 to perform one or more functions. In some embodiments, multiple system applications are powered by $P_{1B}$. In such a case, the variable resistance network 240 can produce multiple outputs for the multiple system applications, or, in alternative embodiments, multiple variable resistance networks 240 are each associated with a single system application or set of system applications. In alternative embodiments, DC power $P_{1A}$ flows directly to system application 250. DC power $P_{1A}$ can likewise comprise multiple outputs coupled to multiple system applications 250 in some embodiments.

A component monitor 212 collects information from at least test components 210A-210X, though in some embodiments the component monitor 212 collects information from any one, or any combination of, the device 214, the voltage regulator 220, the power regulator 230, the variable resistance network 240, and the system application 250. The component monitor 212 collects information such as, though not limited to, voltage, current, resistance, power, temperature, time, and efficiency. In some embodiments the component monitor 212 includes a user-interface presenting the user with the collected information. Additionally, in alternative embodiments, the component monitor 212 includes one or more computer readable storage media which stores the collected information. In alternative embodiments still, the component monitor 212 provides conditional instructions. For example, one of the test components 210A-210X may begin to fail during testing. The component monitor 212 may detect imminent failure of the test component and stop inputting electrical energy to the test component which is beginning to fail.

Figure 3:
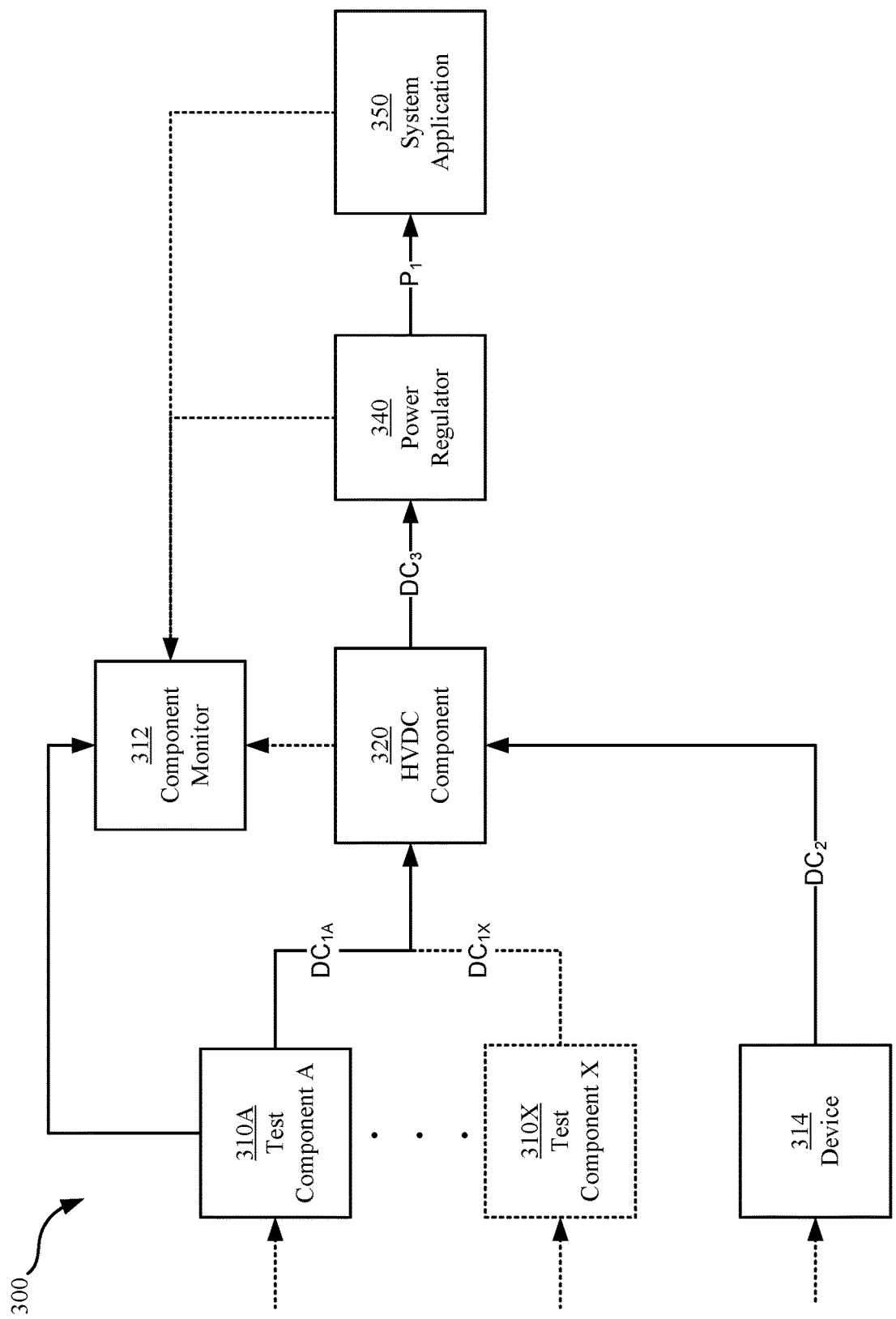
FIG. 3 illustrates a block diagram of another example of a burn-in test system in accordance with some embodiments of the present disclosure.

Referring now to FIG. 3, shown is another example burn-in test system in accordance with some embodiments of the present disclosure. The burn-in system 300 contains one or more test components 310A-310X where "X" represents the total number of test components. The test components 310A-310X (herein also referred to collectively as test components 310) are similar or dissimilar electronic components according to various embodiments. Each of the test components 310 receives a direct current voltage, an alternating current voltage, or no current input (e.g. a battery) according to various embodiments. The one or more test components 310A-310X produce direct current voltage outputs $DC_{1A}$-$DC_{1X}$.

According to various embodiments, a device 314 generates direct current voltage $DC_2$. The device 314 is any device capable of generating a direct current voltage. Exemplary, non-limiting devices 314 are a rectifier, regulator, DC bus, battery, capacitor, and any combination of the aforementioned devices. It is to be understood that the examples of device 314 are non-limiting and a variety of devices are contemplated.

According to some embodiments, the direct current voltages $DC_{1A}$-$DC_{1X}$ and $DC_2$ are collected in a high voltage direct current (HVDC) component 320. The HVDC component 320 receives one or more direct current voltage inputs and produces direct current voltage output DC3. In various embodiments, the HVDC component 320 controls the proportion of the input voltages $DC_{1A}$-$DC_{1X}$ and $DC_2$ used to produce $DC_3$. In some embodiments, the HVDC component 320 matches the voltage of the test component $DC_1$ with the voltage of the device $DC_2$.

The output direct current voltage $DC_3$ is input to a power regulator 340. The power regulator 340 generates a power $P_1$. According to some embodiments, the power regulator 340 is a pulse width modulator (PWM). In some cases where power regulator 340 is a PWM, $P_1$ may be associated with a direct current or an alternating current. As understood by one skilled in the art, in the event $P_1$ is a direct current, the PWM will maintain a substantially constant frequency for a given $P_1$. In the event the direct current is associated with a variable direct current (e.g., a variable speed motor), the PWM will transition between constant frequencies. In the event $P_1$ is associated with an alternating current, the PWM will repeatedly change the frequency to generate a substantially sinusoidal reproduction of the required alternating current.

The system application 350 is any device capable of receiving the power, $P_1$, and as a result of receiving $P_1$, performing one or more functions. In some embodiments, the system application 350 is, for example, a variable speed motor, an electrical ballast, a server, or an electronic component under test. In various embodiments, more than one system application 350 is operated by the power regulator 340.

Component monitor 312 collects information at least from test components 310A-310X, though in some embodiments the component monitor 312 collects information from the device 314, the HVDC component 320, the power regulator 340, the system application 350, or any combination of the aforementioned devices. The component monitor 312 collects information such as, though not limited to, voltage, current, resistance, power, temperature, time, and efficiency. In some embodiments the component monitor 312 includes a user-interface presenting the user with the collected information. Additionally, in some embodiments, the component monitor 312 includes one or more computer readable storage media which stores the collected information. Furthermore, in some embodiments, the component monitor 312 provides conditional instructions. For example, a test component may begin to fail during testing. The component monitor 312 may detect imminent failure of the test component and stop inputting electrical energy to the test component which is beginning to fail. As such, component monitor 312 may contain components such as, but not limited to, memory, storage, processors, I/O devices, network connections, etc. sufficient to store and execute instructions.

Figure 4:
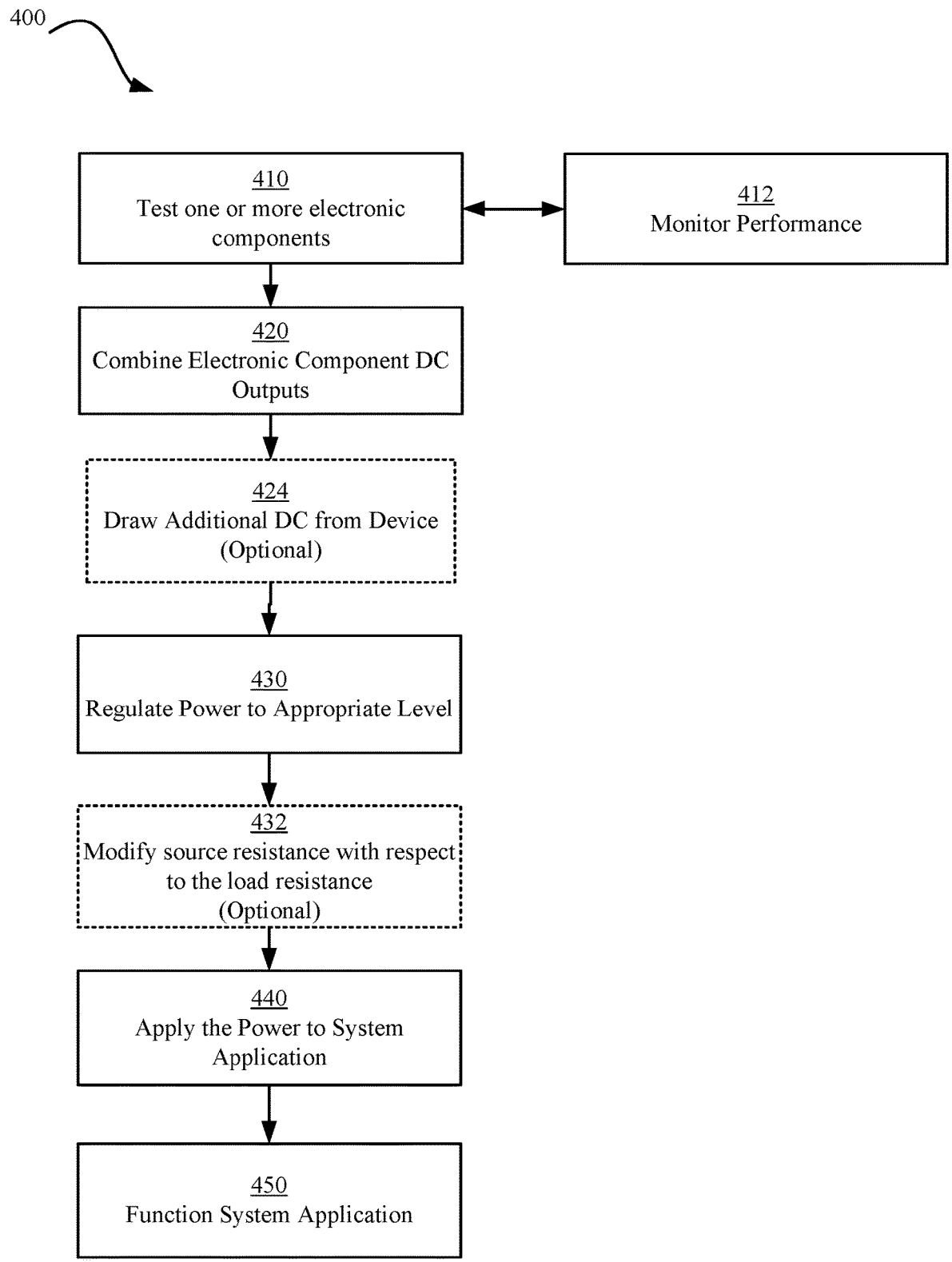
FIG. 4 illustrates a flowchart of a method to re-use the energy output of a tested electronic component in accordance with embodiments of the present disclosure.

Referring now to FIG. 4, shown is a flowchart of a method to reuse the electrical energy of a burn-in test system in accordance with embodiments of the present disclosure. The method 400 starts by testing one or more electronic components in operation 410. The testing of the electronic components 410 comprises operating the test component according to a test regimen by modifying variables such as, but not limited to, voltage, current, resistance, power, temperature, and time. Each test component produces a DC voltage output as a result of the testing. The test components of operation 410 may be the same or substantially the same as test components 110A-110X, 210A-210X, and 310A-310X of FIGS. 1, 2, and 3 respectively.

The respective DC voltage outputs of the one or more test components are combined in operation 420. The combined DC voltage outputs produce a new DC voltage output. The voltage of the new DC output can be changed by, for example, the voltage regulator 220 of FIG. 2 or the HVDC component 320 of FIG. 3. In some embodiments, additional direct current voltage is drawn from an external device in operation 424. Operation 424 is optional as indicated by the dashed lines. In various embodiments the external device of operation 424 is the same or substantially the same as the devices 214 and 314 of FIGS. 2 and 3 respectively. According to some embodiments, the additional power provided in operation 424 is substantially equal to the output of operation 420.

In operation 430, the power is regulated to an appropriate level for a given system application. The power is regulated by any class of regulator such as, but not limited to, a voltage regulator, a linear regulator, a switch regulator, a pulse width modulator (PWM), or any other regulator using electrical, electromechanical, electrochemical, or electromagnetic methods. In various embodiments, operation 430 is conducted by a power regulator, such as power regulator 230 or 340 of FIGS. 2 and 3, respectively.

In some embodiments, operation 432 modifies the resistance of the regulated power level 430 with respect to the resistance of the system application (optional per the dashed box). As understood by one skilled in the art, varying the relationship between the source resistance and the load resistance results in varying degrees of power transfer and transfer efficiency.

Whether or not operation 432 occurs, the regulated power is applied to one or more system applications in operation 440. Consequently, the system application functions in operation 450 as a result of the power input in operation 440.

Throughout the method 400 operation 412 monitors the performance of at least the electronic components being tested. At operation 412 data such as, but not limited to, voltage, current, resistance, power, time, temperature, efficiency, or any combination of the aforementioned metrics, is gathered by a monitor, such as component monitor 212 or 312 discussed above. In some embodiments, at operation 412 performance in additional operations of the method 400 are also monitored, such as, but not limited to, monitoring the power applied to system applications in operation 440 or monitoring the amount of power drawn from an external device in operation 424.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system for testing an electronic component, the system comprising:
    at least two electronic components undergoing burn-in testing, each electronic component under test configured to receive a respective first alternating current voltage and output a respective first direct current voltage;
    a device configured to output a second direct current voltage;
    a power regulator configured to output a first power based on the second direct current voltage and each respective first direct current voltage;
    a system application operably coupled to the power regulator and configured to receive the first power, the system application configured to perform a function as a result of receiving the first power; and
    a component monitor configured to monitor a metric of the at least two electronic components under test.

2. The system of claim 1, further comprising:
    a voltage regulator operably coupled between the power regulator and each of the at least two electronic components undergoing burn-in testing, the voltage regulator configured to receive each respective first direct current voltage and output a third direct current voltage.

3. The system of claim 2, wherein the third direct current voltage and the second direct current voltage are input to the power regulator.

4. The system of claim 3, wherein the voltage regulator is configured to selectively moderate proportions of the first direct current voltages to produce the third direct current voltage.

5. The system of claim 1, wherein the device comprises a rectifier.

6. The system of claim 1, wherein each electronic component comprises a respective power supply.

7. The system of claim 1, wherein the component monitor includes a user interface configured to display the metric of each respective electronic component under test.

8. The system of claim 1, wherein the metric is selected from the group consisting of: a voltage, a current, a power, a resistance, a temperature, a time, and an efficiency.

9. The system of claim 1, wherein the first power is exclusively based on the second direct current voltage in response to an indication of failure of a respective electronic component of the at least two electronic components.

10. The system of claim 1, wherein each respective first direct current voltage is between 3-12 volts.

11. A method for testing an electronic component, the method comprising:
    burn-in testing at least two electronic components, each of the at least two electronic components configured to receive a respective first alternating current voltage and output a respective first direct current voltage;
    combining each respective first direct current voltage;
    regulating, as a result of the combining, each respective first direct current voltage to produce a second direct current voltage, wherein the second direct current voltage comprises a selective proportion of each respective first direct current voltage;
    regulating the second direct current voltage and a third direct current voltage to output a first power having a first resistance, wherein the first power comprises a selective proportion of the second direct current voltage and the third direct current voltage, wherein the third direct current voltage is output by a device;
    applying the first power to a system application having a second resistance, wherein the system application is configured to perform a function;
    performing, as a result of the applying the first power to the system application, the function; and
    monitoring a metric of each of the at least two electronic components.

12. The method of claim 11, wherein the system application functions via a direct current power input.

13. The method of claim 11, further comprising:
    modifying the first resistance to equal the second resistance using a variable resistance network.

14. The method of claim 11, wherein the second direct current voltage is larger than a combination of each respective first direct current voltage.

* * * * *